United States Patent [19]

Hanrahan

[11] Patent Number: 5,360,698
[45] Date of Patent: Nov. 1, 1994

[54] DEEP UV LIFT-OFF RESIST PROCESS

[75] Inventor: Michael J. Hanrahan, Hilton, N.Y.

[73] Assignee: Eastman Kodak Company, Rochester, N.Y.

[21] Appl. No.: 947,589

[22] Filed: Sep. 21, 1992

[51] Int. Cl.$^5$ .......................... G03F 7/30; G03C 5/00
[52] U.S. Cl. ........................ 430/324; 430/7;
    430/156; 430/326; 430/329; 430/330
[58] Field of Search ............... 430/324, 323, 326, 325,
    430/330, 329, 7, 156, 312

[56] References Cited

U.S. PATENT DOCUMENTS

| | | | |
|---|---|---|---|
| 3,873,313 | 3/1975 | Horst et al. | 430/312 |
| 4,256,816 | 3/1981 | Dunkleberger | 430/324 |
| 4,533,624 | 8/1985 | Sheppard | 430/312 |
| 4,534,620 | 8/1985 | Gale et al. | 350/166 |
| 4,557,797 | 12/1985 | Fuller et al. | 430/312 |
| 5,227,280 | 7/1993 | Jubinsky | 430/270 |

OTHER PUBLICATIONS

W. M. Kramer and D. M. Hoffman, J. of Imaging Technology, vol. 12, No. 5, Oct. 1986.
Frary and Seese, Semiconductor International, pp. 72-88, Dec. 1981.

Primary Examiner—Charles L. Bowers, Jr.
Assistant Examiner—John S. Chu
Attorney, Agent, or Firm—Raymond L. Owens

[57] ABSTRACT

A lithographic patterning process which produces a lift-off structure uses two separate layers, the bottom being deep ultraviolet patternable and the top being patternable at an appropriate wavelength other than deep ultraviolet and having low optical transmission properties at the wavelength used in a deep ultraviolet exposure step and characterized by decreased solubility and/or increased crosslink density after such deep ultraviolet exposure.

7 Claims, 4 Drawing Sheets

DEEP UV LIFT-OFF RESIST PROCESS

FIELD OF THE INVENTION

This invention relates to making color filter arrays for solid state electronic sensors and displays

BACKGROUND OF THE INVENTION

Color filter arrays are employed in combination with sensors to define color images or in combination with display devices to permit color images to be viewed. A common approach to producing color filter arrays has been to use organic dyes embedded in a layer which has been patterned by various techniques to render the appropriate filter pattern. This approach has two significant disadvantages. The spectral characteristics of the filter are controlled by the absorbance curves of the dye and layer materials. Altering the spectral characteristics, therefore, requires altering the dye or layer material, which can be a difficult and time consuming process. Furthermore, the dyes may be subject to fading with time especially under harsh environmental operating conditions such as high light.

An alternative, which overcomes the disadvantages of the organic dye approach, has been to produce color filter arrays from interference filters made up of alternating layers of two dielectric materials with different refractive indices. Various combinations of pairs of dielectric materials, deposition and patterning techniques have been used.

Lithographic techniques based upon removing unwanted areas using photoresist as an etch mask have been developed (M. T. Gale and H. W. Lehmann, U.S. Pat. No. 4,534,620, Aug. 13, 1985). For etch processes, however, there are a number of problems which must be overcome. Chemistries which will attack both dielectric materials at comparable rates are needed. Then a masking material must be found which is compatible with that etch. Additional lithographic steps may be required to pattern the masking material. Multi-step etch processes, necessary to produce different filters on the same device, will require an etch stop layer. The process of patterning by etching also does not lend itself readily to changes in dielectric materials or deposition techniques.

Another technique employs a "pseudo-lift-off" process for patterning of brittle, dielectric materials (W. M. Kramer and D. M. Hoffman, J. of Imaging Technology, V. 12, No. 5, October 1986). Conventional positive-working photoresists are lithographically patterned in the usual manner. The filter materials are deposited on top of the resist and onto the substrate through the openings in the resist. Immersion into a solvent removes the resist and unwanted filter areas by a cohesive failure mechanism. The technique relies upon the materials cracking along the edges of the resist pattern and is an inherently unreliable process.

Compared with etch processes, a lift-off process represents a good general purpose technique and offers some advantages in process simplicity. To achieve the maximum process control and resolution, it is desirable that a overhanging or reentry resist sidewall profile be generated. This more traditional technique has been used to pattern filters, however, this requires a resist lift-off process which can be coated thicker than the thickest filter. Typical thicknesses for dielectric stack filters are greater than 1 $\mu$m and usually range between 2 and 4 $\mu$m. Unfortunately, most lift-off processes which produce reentry sidewall profiles have been developed for metallization purposes where the resist coatings are 1 to 1.5 $\mu$m thick.

These types of lift-off processes can be categorized into four groups. Some lift-off systems are based upon combinations of light sources and chemistries which photochemically result in retrograde resist edge profiles after development. Image reversal techniques produce similar profiles. In image reversal, exposed areas are chemically altered to decrease solubility. Unexposed areas are subsequently exposed and developed away. The most widely employed technique is known as the chlorobenzene process. By treating a resist coating with chlorobenzene it is possible to alter the dissolution characteristics of the surface such that the overhang structure is produced during development. Silylation techniques have also been used which modify the etching characteristics of a resist surface. Multi-layer resist technology is an area that has received much investigation. Consequently, many permutations using two or three layers of different materials have been reported. A review article by Frary and Seese, *Semiconductor International*, pages 72–88 (December 1981), discusses the various approaches that have been explored. Of particular relevance is the discussion of structures comprising two layers of positive-working photoresist. The application of one resist onto another suffers from intermixing of the two similar materials such that the development characteristics gradually change throughout the layers; consequently it is difficult to produce the desired overhang structure. Plasma etch or thermal treatment has been used to alter the surface characteristics of the bottom resist layer to produce a "buffer" layer which prevents intermixing. This process allows the top resist layer to be coated uniformly and maintains the distinction between the two layers. Two resist materials may be chosen such that they either exhibit different dissolution rates in the same developer or else they use mutually exclusive developers. In this case, an overhang structure can be produced. Depending upon the treatment conditions used to form the buffer, it may be necessary to use a two step development process with an intermediate etch step to remove the buffer layer. The use of a double resist lift-off process which provided an improved technique for patterning interference filters has been described in the above referenced Hanrahan patent application. Although this process is effective, the nature of the materials used, however, limits the deposition temperatures to less than 130° C. The physical and optical properties of the final interference filters are optimal when deposited at higher temperatures so that a lift-off process capable of withstanding higher deposition temperatures is desirable.

In terms of ease of manufacturability, the technique used for patterning dichroic filters should be as simple and robust as possible. In other words, the number of processing steps and critical process controls should be minimized. In addition, there should be a wide margin in control factor settings which still result in acceptable product. Etching processes, as indicated previously, require specific etch chemistry and material choices. Suitable masking and etch stop materials must be found that are compatible with the aforementioned etch chemistry. This usually means a pattern transfer process just to produce the appropriate pattern in the etch mask material. Dry etching techniques also have many process controls that have to be monitored and maintained in a manufacturing environment.

SUMMARY OF THE INVENTION

It is an object of this invention to provide a lithographic patterning process based upon lift-off technology which eliminates the above problems and which results in an improved overhang lift-off structure.

This object is achieved by a lithographic patterning process which results in an overhang lift-off structure, comprising the steps of:

(a) coating a first layer of a first positive photoresist material on a substrate, the first photoresist material being deep ultraviolet patternable characterized by a decrease in molecular weight;

(b) depositing a second layer of a second photoresist over the first photoresist material, the second photoresist material being patternable at an appropriate wavelength other than deep ultraviolet and having low optical transmission properties at the wavelength used in a deep ultraviolet exposure step and characterized by decreased solubility and/or increased crosslink density after such deep ultraviolet exposure;

(c) patternwise exposing the second photoresist layer with light at an appropriate wavelength other than such deep ultraviolet exposure;

(d) developing the exposed portions of the second photoresist layer for a sufficient time to provide openings in the second photoresist layer;

(e) deep ultraviolet flood exposing of the remaining second photoresist layer and the first photoresist layer through the openings produced in the second photoresist layer while simultaneously heating the first layer to a temperature selected to be sufficiently high enough to result in enhanced development of the first photoresist material; and (f) developing of the exposed portions of the first photoresist material for a sufficient time to provide openings in the first photoresist layer wherein the second photoresist layer overhangs the first photoresist layer to provide a lift-off structure.

DETAILED DESCRIPTION OF THE PREFERRED EMBODIMENTS

Figure 1:
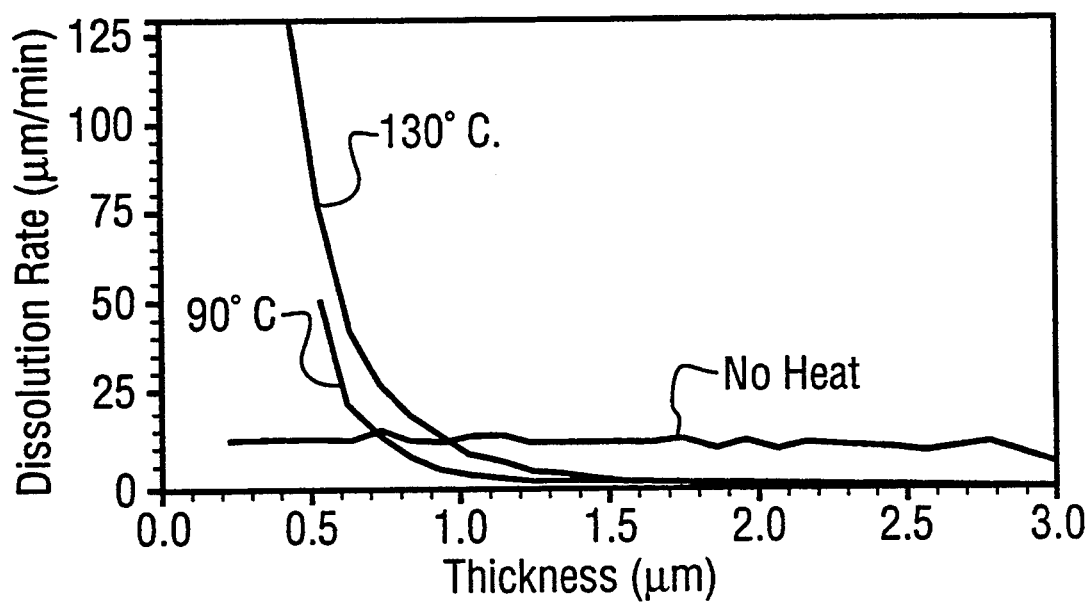
FIG. 1 is a graph of dissolution rate versus layer thickness, wherein zero refers to the top surface of the layer, for three heat treatments during exposure.

The lithographic process is characterized by the simultaneous application of deep ultraviolet radiation and heat to pattern the first photoresist layer. Any combination of photoresists can be used that meet the requirements that the deep UV resist is a positive-working deep ultraviolet patternable polymeric material in which the photochemical mechanism responsible for patterning is the photo-induced cleavage of the polymer molecules so that a lower molecular weight is produced upon exposure [such as poly(methyl methacrylate), poly(methyl isopropenyl ketone), poly(dimethyl glutarimide), etc.] and that the second resist is a positive-working photoresist which when exposed to deep ultraviolet radiation and heat becomes more insoluble and possibly crosslinked and which transmits less than 1% of the deep UV radiation used in the flood exposure step (such as all commercial novolac-based positive photoresists). Positive-working is understood to mean that the spatial regions of the coating that are exposed to the actinic radiation are the same areas that are removed during subsequent development and unexposed areas remain intact.

The thickness of the individual layers are controlled by the coating process and may be varied easily. Typically, lift-off processes have been developed for thicknesses in the 1–1.2 μm range. However, dielectric stack color filters require lift-off processes in the 2–4 μm range. A process in accordance with this invention can be used to give lift-off structures in virtually any thickness range and is only limited by the thickness limits of the coating process and the materials employed.

The degree of undercut is controlled by the time and temperature during the deep UV flood exposure step and by the development time. During the development step, the initial overhang profile is rapidly produced then further undercutting proceeds at a much slower rate, therefore, the degree of undercut is easily controlled. This process results in an extremely simple and yet very robust technique for producing lift-off resist profiles in which the degree of undercut, height of overhang or thickness of the overhang layer can be manipulated easily and over a large range.

In addition, the overhanging structures, once formed, are able to withstand temperature up to 200° C. without any significant deformation in the overhang such as flowing or sagging. It is therefore, possible to deposit materials at a temperatures not normally realized with organic resist systems resulting in improved material characteristics while still providing the versatility of the lift-off patterning technique.

While the emphasis of this invention is on a patterning process for dielectric stack filters, it should be understood that the patterning process can be applied to any host of materials (i.e., metals, oxides, etc.) which may be deposited using vacuum coating techniques such as evaporation, sputtering, and the like.

Any combination of positive photoresists which fit the aforementioned criteria can be used to produce lift-off profiles. It is also preferable, but not necessary, that both resist layers are developed in the same developer system such as an aqueous base developer or organic solvent as this minimizes interfacial layer problems and simplifies the processing sequence. This is exemplified by the combination of two commercial resist materials; Shipley SAL100-PL1 [a poly(dimethyl glutarimide) positive-working deep UV photoresist] and Baker PR-21 (a novolac-based positive-working photoresist) which are both developed by an aqueous solution of a quaternary ammonium hydroxide.

The simultaneous application of heat and radiation results in enhanced dissolution behavior of the deep UV resist not seen by the independent application of either heat or radiation alone which is novel and unexpected. FIG. 1 illustrates this point with the SAL110-PL1 resist. In FIG. 1 there is shown a comparison of dissolution rates of SAL110-PL1 resist films that are exposed without (no heat) and with the simultaneous application of heat to varying temperatures (90° and 130° C.). At those regions near the top surface of the resist layer (i.e., closest to exposing source) the dissolution rates are considerably greater than for the film which was not heated during exposure. Heating films to temperatures greater than 150° C. results in abnormal dissolution characteristics so that only global dissolution rates can be measured. Table I lists the time ($T_c$) required to completely develop a 3 μm thick film of the resist for different heating conditions during exposure and shows that heating during exposure enhances the dissolution rates under identical exposure and development conditions. It is also well established that the simultaneous application of heat and novolac-based deep UV radiation to photoresists will result in films that are highly crosslinked and therefore thermally and mechanically more resistant to deformation.

TABLE I

Dissolution Characteristic of SAL110-PL1 for Varying Exposing Conditions

| Exposure Temperature | $T_c$ |
|---|---|
| No Heat | 15.09 sec |
| 180° C. | 3.00 sec |

FIG. 2 is a schematic representation of the formation of an overhang resist structure and the deposition of a dielectric color filter stack and final lift-off step. As shown in FIG. 2a, first a deep UV patternable positive-working photoresist layer (12) characterized by a decrease in molecular light is deposited on a substrate 10. Thereafter, a second different positive photoresist layer 14 (which can be a conventional novolac-based photoresist) is deposited on the first photoresist layer. This photoresist layer has low optical transmission properties at the wavelengths used in a deep ultraviolet exposure step and characterized by decreased solubility and/or increased crosslink density after such deep ultraviolet exposure. Layer 14 is patternable at a wavelength other than deep ultraviolet.

Figure 2A:
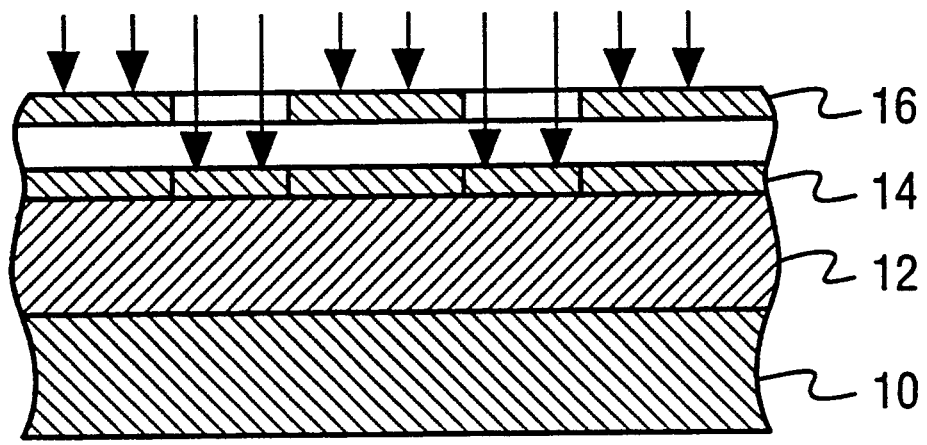
FIG. 2a-f shows various steps in the method according to this invention.
Figure 2B:
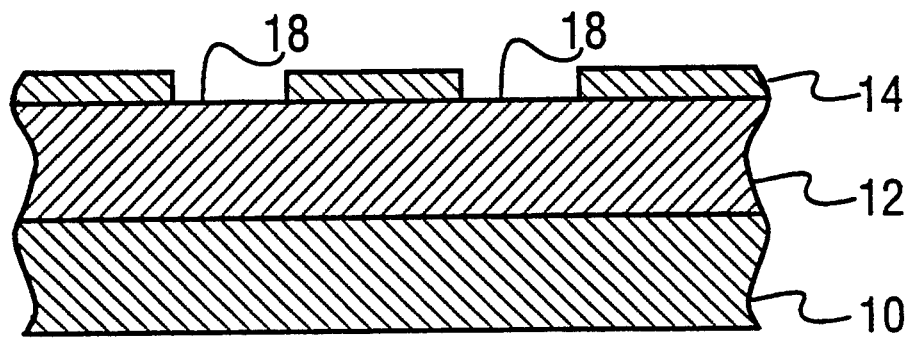
Figure 2C:
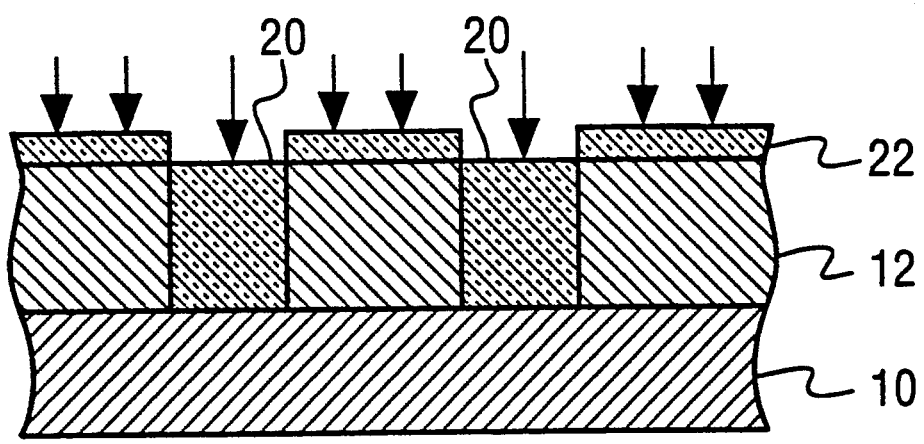
Figure 2D:
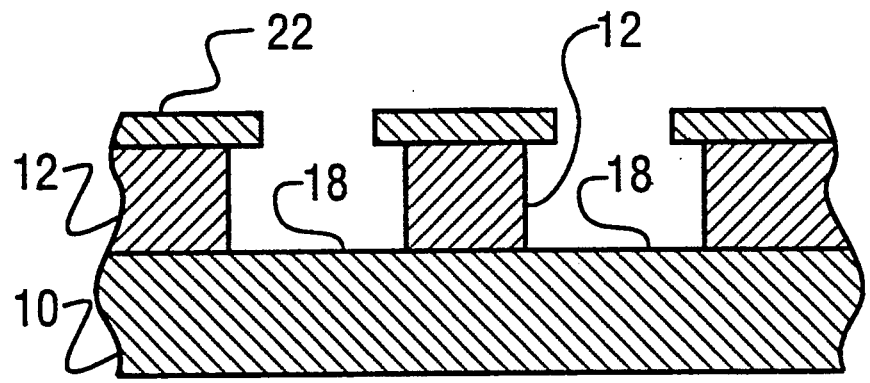
Figure 2E:
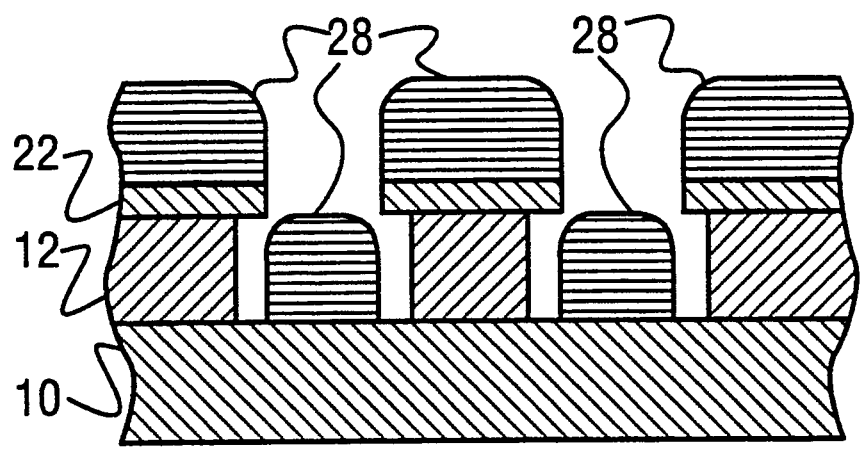
Figure 2F:
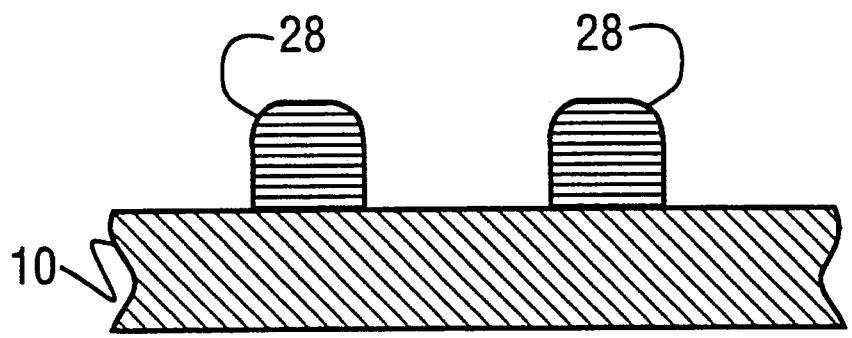

After a patternwise exposure of FIG. 2a, in which a mask 16 having suitable arranged patterns of clear and opaque areas is used to produce the desired developable pattern in the second photoresist layer, the exposed area in the second resist layer is developed to produce an opening 18 (see FIG. 2b). With novolac-based positive-working photoresists, appropriate wavelengths for patternable exposures cover the range of 350–450 nm. A subsequent flood exposure utilizing a deep ultraviolet radiation source (a source whose predominant light output is at wavelengths of less than 330 nm) results in the first resist layer being exposed in the regions in which no second resist layer is present 20 (see FIG. 2c) and exposure of the remaining regions of the second layer 22. The substrate is heated by conventional means so that by conduction, convection and/or radiation the first layer is heated to 90°–220° C. during deep UV exposure. Development rapidly removes the first resist exposed through the openings and some of the first resist layer that is under the second resist resulting in an overhanging structure (FIG. 2d). Continued development increases the length of the overhang but at a significantly reduced rate. Because the exposed lower layer is removed rapidly during the early stages of the development process, the unexposed layer is attacked by the developer in a nearly uniform manner giving an isotropic undercut structure. The remaining regions of the second resist 22 are also chemically altered by the deep UV flood exposure (presumably crosslinked) and are therefore unaffected by subsequent thermal and chemical treatments so that deformation of the overhang does not occur. Deposition of the dielectric color filter stack 28 as shogun in FIG. 2e results in a discontinuity between the material deposited on the substrate and on the resist. The deposition is performed in an evaporator equipped with two crucibles containing two materials of different refractive indices. Alternating depositions of each material is accomplished by alternating heating of each crucible. The substrates 10 are held in a holder which rotates during the deposition to improve coating uniformity. This discontinuity allows a solvent for the resist materials to dissolve away the first resist, causing the dielectric stack deposited on the resist to float away in the solvent i.e. "lift-off" (see FIG. 2f). The solvent used may be the same as that used to produce the developed patterns in FIG. 2. However, other solvents which are known to dissolve the first photoresist can be used.

EXAMPLE 1

Resist Processing WITHOUT Simultaneous Heating During Exposure

A coating of SAL110-PL1 resist was made onto a cleaned 4" silicon wafer by spin coating at 2400 rpm and baked on a hot plate at 230° C. for 45 seconds. A second coating was applied to the first using the same processing conditions to give a final coating thickness of 3.2 μm. Upon this, a coating of KTI-822 photoresist was made by spin coating at 5000 rpm to give a 1.2 μm coating after a hot plate bake at 125° C. for 45 seconds. The wafer was patternwise exposed using a Canon PLA Contact Aligner at 6 LI and developed with KTI-934 developer at a concentration of 1:1 for 40 seconds. One LI being equivalent to an integrated exposure energy level of 35 mj/cm$^2$ over the range of 350–450 nm. The pattern of the KTI-822 resist layer was confirmed by optical inspection and 3 μm lines and spaces were clearly resolved. The wafer was then flood exposed to deep UV radiation (wavelengths of 220–350 nm) on an HTC source using an 11-2-2 mirror. Exposure was measured at 10.8 J/cm$^{-2}$ using a 220 nm probe. The resist was developed with the 1:1 KTI-934 developer for 70 seconds. SEMS showed that the KTI-822 resist layer was intact and that the SAL110-PL1 layer was developed but an overhang structure was not produced.

EXAMPLE 2

Resist Processing WITH Application of Heat During Exposure

Four inch silicon wafers were coated with SAL110-PL1 resist to give 1.5 μm thick coatings after a 180° C. hot plate bake for 45 seconds. The wafers were coated a second time under identical conditions to give a cumulative thickness of 3 μm. Upon this was coated a 1.2 μm layer of KTI-822 photoresist at 5000 rpm and baked at 125° C. for 40 seconds. The wafer was patternwise exposed using a Canon PLA Contact Aligner at 6 LI and developed with KTI-934 developer at a concentration of 1:1 for 40 seconds. A wafer was then exposed on the Microlite Deep UV Stabilization System using the D mirror for 250 seconds with heating at a rate of 0.6°/sec up to 180° C. from a starting temperature of 120° C. The spectral output of the exposing system covered the range of 240–350 nm. The resist was developed for two minutes with the KTI-934 developer. Cross-sectional SEMs showed that an overhanging structure was produced with an overhang of 0.7 μm.

EXAMPLE 3

Lift-Off Processing

Another wafer, which received similar processing as Example 2, was then subjected to a dielectric stack filter deposition process in which 34 layers of silicon dioxide and titanium dioxide were deposited in alternating layers. The deposition was performed in a Balzers BAK-640 Electron Beam Evaporator equipped with two crucibles (one for each material) while the wafers were radiatively heated up to 150° C. The final thickness of the dielectric stack was 2.85 μm. Cross-sectional SEMs of the sample showed that the resist had maintained the original profile without any evidence of deformation. A discontinuity of the dielectric stack between the layers on top of the resist and on the substrate was also evident. The sample was placed into a bath of Shipley Microposit 1165 remover. After two hours, all of the resist portions had been removed with the accompanying dielectric stack filter and the filters deposited directly onto the substrate remained. Good pattern fidelity was maintained as evidenced by the resolution targets and cross-sectional SEMs showed a clean separation and filter edge.

EXAMPLE 4

Figure 3:
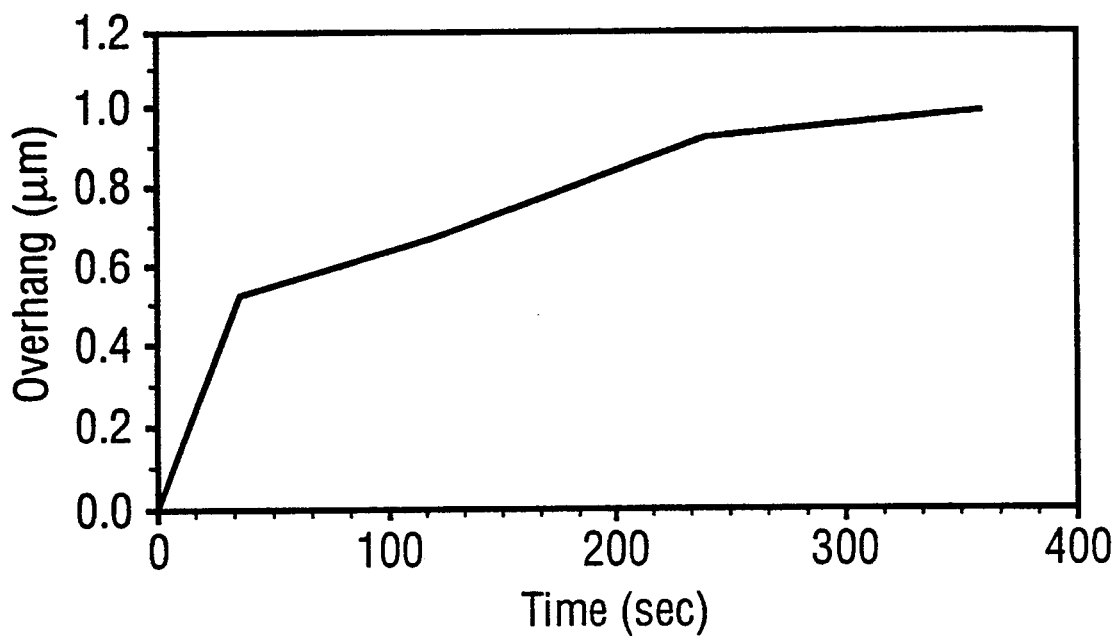
FIG. 3 is a graph of overhang size versus development time for a particular heat/exposure treatment.

Resist Processing WITH Application of Heat During Exposure; Development Sequence A wafer was processed as detailed in Example 2. After the deep UV exposure step, the wafer was cleaved into fourths. Each piece was subjected to the development process with KTI-934 developer for varying times according to Table II. Cross-sectional SEMs were obtained on each sample and the length of the overhang measured from the SEM. These results were also plotted in FIG. 3, which shows that the overhang structure is formed very rapidly during the early stages of development but that rate of change in the overhang decreases as development progresses so that it behaves as a self-limiting process.

TABLE II

| Develop Time (sec) | Overhang (μm) |
| --- | --- |
| 35 | 0.52 |
| 120 | 0.68 |
| 240 | 0.93 |
| 360 | 1.00 |

EXAMPLE 5

Resist Processing WITH Application of Heat During Exposure; Temperature Effects

Two wafers were coated with SAL110-PL1 and KTI-822 resist and then patternwise exposed and developed as detailed in Example 2. During the deep UV exposure step, the heating conditions were varied according to Table III. After the exposure, each wafer was cleaved and each section developed for a different amount of time as detailed in Table III. The final samples were cleaved and cross-sectional SEMs obtained. Overhang sizes were determined directly from the SEM and are listed in Table III.

TABLE III

Figure 4:
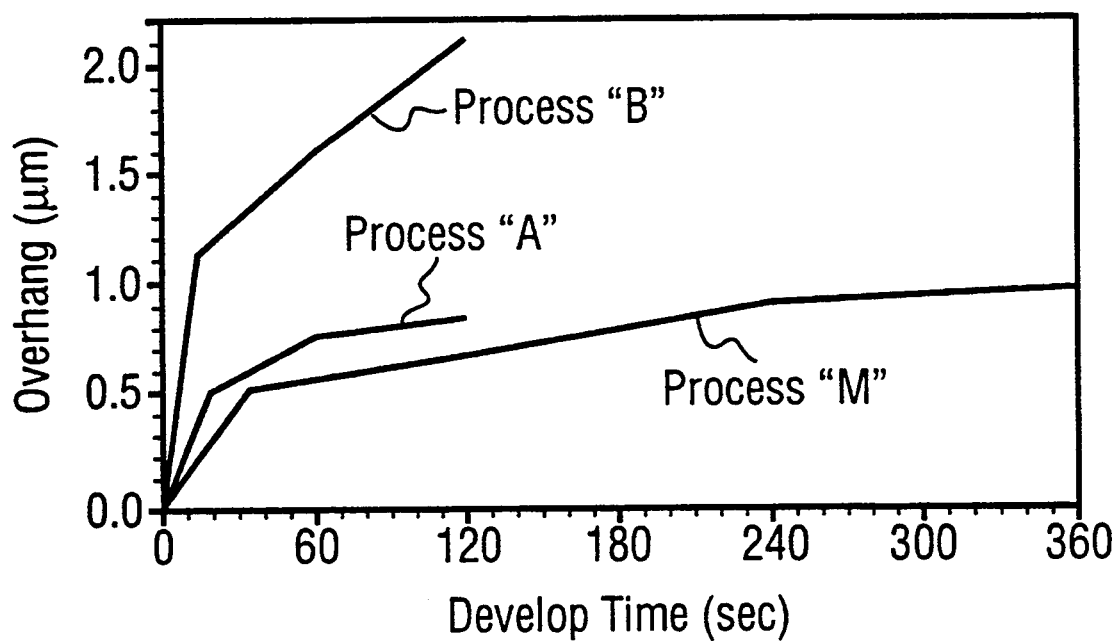
FIG. 4 is a graph of overhang size versus development time for three heat/exposure treatments.

| Process | Final Temp. (°C.) | Ramp Rate (sec) | Develop Time (°C./sec) | Overhang (μm) |
| --- | --- | --- | --- | --- |
| M | 180 | 0.6 | 35 | 0.52 |
| " | " | " | 120 | 0.68 |
| " | " | " | 240 | 0.93 |
| " | " | " | 360 | 1.00 |
| A | 180 | 2 | 20 | 0.5 |
| " | " | " | 60 | 0.77 |
| " | " | " | 120 | 0.86 |
| B | 220 | 0.6 | 15 | 1.13 |
| " | " | " | 60 | 1.6 |
| " | " | " | 120 | 2.13 | total exposure time 250 seconds, starting temperature 120° C., developed with 1:1 KTI-934 developer, A plot of the overhang size versus develop time for all three processes is shown in FIG. 4. The difference between process A and M is that the ramp rate is higher resulting in the resist being exposed at 180° C. for a longer time (i.e., 220 seconds and 150 seconds, respectively). The overhang dimensions at a given development time suggest little or no increase in the overhang due to increased exposure time. A comparison of processes B and M shows that a significant increase in overhang for a given development time results from the higher final exposure temperature. The constant ramp rate means that the exposure tune was significantly different at the final temperature between process B and M (i.e., 83 seconds and 150 seconds, respectively). Nevertheless, the higher final temperature even at a shorter time resulted in a two-fold increase in overhang dimension.

The invention has been described in detail with particular reference to certain preferred embodiments thereof, but it will be understood that variations and modifications can be effected within the spirit and scope of the invention.

I claim:

1. A lithographic patterning process which results in an overhang lift-off structure, comprising the steps of:
    (a) coating a first layer of a first positive photoresist material on a substrate, the first photoresist material being deep ultraviolet patternable characterized by a decrease in molecular weight;
    (b) depositing a second layer of a second photoresist over the first photoresist material, the second photoresist material being patternable at a second layer exposure wavelength that is suitable for exposing the second layer but not suitable for exposing the first layer, the second layer having low optical transmission properties at the wavelength used in a deep ultraviolet exposure step and characterized by decreased solubility and/or increased crosslink density after such deep ultraviolet exposure;
    (c) patternwise exposing the second photoresist layer with light at the second layer exposure wavelength;
    (d) developing with a liquid developer the exposed portion of the second photoresist layer for a sufficient time to form openings in the second photoresist layer;
    (e) deep ultraviolet flood exposing of the remaining second photoresist layer and the first photoresist layer through the openings produced in the second photoresist layer while simultaneously applying heat to the first layer; and
    (f) developing of the exposed portions of the photoresist material to form openings in the first photoresist layer wherein the second photoresist layer overhangs the first photoresist layer to provide a lift-off structure.

2. The process of claim 1 further including the steps of:
(g) depositing a stack of dielectric layers on the exposed portions of the second photoresist layer and in the openings to provide color filter arrays; and
(h) using a solvent to dissolve the first photoresist layer and to lift-off the dielectric stack on the second photoresist layer without affecting the color filter arrays.

3. The process of claim 1 wherein the same developer is used in steps d and f.

4. The process of claim 1 wherein the first layer is heated within the range of 90°–220° C.

5. A lithographic patterning process which results in an overhang lift-off structure as claimed in claim 1, wherein the first layer is heated to a temperature of 180° C. from a starting temperature of 120° C. at a rate of 0.6° C./Sec in step (e).

6. A lithographic patterning process which results in an overhang lift-off structure as claimed in claim 1, wherein the first layer is heated to a temperature of 180° C. from a starting temperature of 120° C. at a rate of 2.0° C./Sec in step (e).

7. A lithographic patterning process which results in an overhang lift-off structure as claimed in claim 1, wherein the first layer is heated to a temperature of 220° C. from a starting temperature of 120° C. at a rate of 0.6° C./Sec. in step (e).

* * * * *